(12) United States Patent
Hashizume et al.

(10) Patent No.: US 12,016,132 B2
(45) Date of Patent: Jun. 18, 2024

(54) BASE MATERIAL FOR PRINTED CIRCUIT BOARD AND METHOD OF MANUFACTURING BASE MATERIAL FOR PRINTED CIRCUIT BOARD

(71) Applicant: SUMITOMO ELECTRIC INDUSTRIES, LTD., Osaka (JP)

(72) Inventors: Kayo Hashizume, Osaka (JP); Masamichi Yamamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 893 days.

(21) Appl. No.: 17/041,158

(22) PCT Filed: Mar. 27, 2019

(86) PCT No.: PCT/JP2019/013276
§ 371 (c)(1),
(2) Date: Sep. 24, 2020

(87) PCT Pub. No.: WO2019/208077
PCT Pub. Date: Oct. 31, 2019

(65) Prior Publication Data
US 2021/0014978 A1  Jan. 14, 2021

(30) Foreign Application Priority Data

Apr. 26, 2018 (JP) .................. 2018-085847

(51) Int. Cl.
*H05K 3/38* (2006.01)
*H05K 1/03* (2006.01)

(52) U.S. Cl.
CPC ............... *H05K 3/382* (2013.01); *H05K 1/03* (2013.01); *H05K 2201/032* (2013.01); *H05K 2203/095* (2013.01); *H05K 2203/1131* (2013.01)

(58) Field of Classification Search
None
See application file for complete search history.

(56) References Cited

U.S. PATENT DOCUMENTS

2018/0070454 A1* 3/2018 Meng ................. H05K 3/381

FOREIGN PATENT DOCUMENTS

| JP | 2016-110690 | 6/2016 |
| JP | 2016-136595 | 7/2016 |
| JP | 2017-534747 | 11/2017 |

* cited by examiner

*Primary Examiner* — Jeffrey D Washville
(74) *Attorney, Agent, or Firm* — IPUSA, PLLC

(57) ABSTRACT

A base material for a printed circuit board includes a base film having an insulating property, and a sintered body layer including metal particles and layered on at least one surface of the base film. The sintered body layer includes sintered particles that are derived from the metal particles and partially embedded into the surface of the base film. The embedment ratio of the sintered particles is greater than or equal to 10% and less than or equal to 90%.

11 Claims, 2 Drawing Sheets

BASE MATERIAL FOR PRINTED CIRCUIT BOARD AND METHOD OF MANUFACTURING BASE MATERIAL FOR PRINTED CIRCUIT BOARD

TECHNICAL FIELD

The disclosures herein relate to a base material for a printed circuit board and a method of manufacturing a base material for a printed circuit board.

The present application is based on and claims priority to Japanese patent application No. 2018-85847, filed on Apr. 26, 2018, with the Japanese Patent Office, the entire contents of which are hereby incorporated by reference.

BACKGROUND ART

A base material for a printed circuit board that includes an insulating base film and a metal layer layered on one surface of the base film is known.

Conventionally, as such a base material for a printed circuit board, a base material for a printed circuit board in which a seed layer is formed on one surface of a base film by a sputtering method is employed. The base material for a printed circuit board that uses the sputtering method requires expensive vacuum equipment for physical vapor deposition. Therefore, in recent years, a relatively inexpensive base material for a printed circuit board that does not use the sputtering method is proposed.

As such a relatively inexpensive base material for a printed circuit board that does not use the sputtering method, a base material for a printed circuit board that includes an insulating base film and a sintered body layer of metal particles layered on one surface of the base film is devised (see Japanese Laid-open Patent Publication No. 2016-136595).

RELATED-ART DOCUMENTS

Patent Documents

Patent Document 1: Japanese Laid-open Patent Publication No. 2016-136595

SUMMARY OF THE INVENTION

According to one aspect of the present disclosure, a base material for a printed circuit board includes a base film having an insulating property, and a sintered body layer including metal particles and layered on at least one surface of the base film. The sintered body layer includes sintered particles that are derived from the metal particles and partially embedded into the surface of the base film. The embedment ratio of the sintered particles is greater than or equal to 10% and less than or equal to 90%.

According to one aspect of the present disclosure made in order to solve the above-noted problems, a method of manufacturing a base material for a printed circuit board includes a step of layering a sintered body layer on at least one surface of a base film having an insulating property, and a step of applying plasma treatment to a surface of the sintered body layer after the step of layering. The sintered body layer includes sintered particles formed by sintering metal particles. In the step of applying the plasma treatment, the sintered particles derived from the metal particles are partially embedded into the surface of the base film. The embedment ratio of the sintered particles is greater than or equal to 10% and less than or equal to 90%.

MODE FOR CARRYING OUT THE INVENTION

Figure 1:
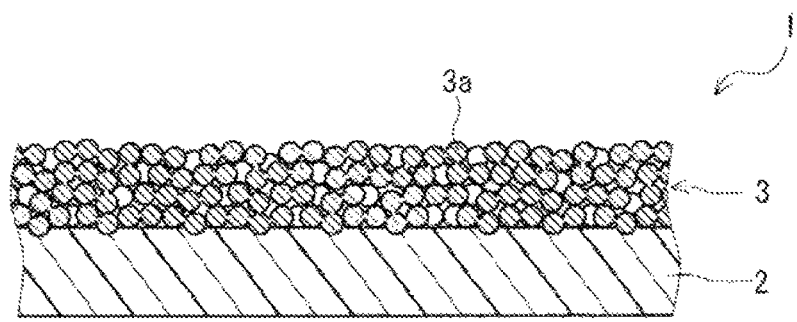
FIG. 1 is a schematic cross-sectional view of a base material for a printed circuit board according to an embodiment of the present disclosure.

Problem to be Solved by the Present Disclosure

It is desirable for the above-described base material for a printed circuit board to have high adhesion between the base film and the sintered body layer. In particular, a base material for a flexible printed circuit board having flexibility requires high adhesion between a base film and a sintered body layer in order to prevent the peeling of the sintered body layer from the base film when bending stress is applied.

In view of the above, the present disclosure has an object to provide a base material for a printed circuit board and a method of manufacturing a base material for a printed circuit board, which are excellent in adhesion between a base film and a sintered body layer.

Effect of the Present Disclosure

A base material for a printed circuit board according to an embodiment of the present disclosure is excellent in adhesion between a base film and a sintered body layer. Further, according to a method of manufacturing a base material for a printed circuit board, the base material for a printed circuit board excellent in adhesion between a base film and a sintered body layer can be manufactured.

DESCRIPTION OF EMBODIMENTS OF THE PRESENT INVENTION

First, aspects of the present disclosure will be listed and described.

According to one aspect of the present disclosure, a base material for a printed circuit board includes a base film having an insulating property, and a sintered body layer including metal particles and layered on at least one surface of the base film. The sintered body layer includes sintered particles that are derived from the metal particles and partially embedded into the surface of the base film. The embedment ratio of the sintered particles is greater than or equal to 10% and less than or equal to 90%.

In the above-described base material for a printed circuit board, the sintered body layer includes sintered particles that are derived from the metal particles and partially embedded into the surface of the base film, and the embedment ratio of the sintered particles is within the above-described range. Therefore, the sintered particles firmly adhere to the base film by a physical anchoring effect. Accordingly, the above-described base material for a printed circuit board is excellent in adhesion between the base film and the sintered body layer.

The above-described metal particles are preferably copper particles each having a diameter of greater than or equal to 1 nm and less than 1 μm. When the above-described metal particles are copper particles each having a diameter of greater than or equal to 1 nm and less than 1 μm, it is possible to form an inexpensive and highly conductive sintered body layer that does not readily peel from the base film.

The peel strength between the base film and the sintered body layer is preferably greater than or equal to 7.5 N/cm. When the peel strength between the base film and the sintered body layer is greater than or equal to the above-described lower limit, it is possible to minimize the peeling of the sintered body layer from the base film.

The contact area ratio represented by (A−B)/B·100 is preferably greater than or equal to 0.05% and less than or equal to 0.50%, where A denotes the contact area between the base film and the sintered body layer including the metal particles, and B denotes the projected surface area of the base film. When the contact area ratio is within the above-described range, it is possible to securely improve the adhesion between the base film and the sintered body layer.

Further, according to one aspect of the present disclosure, a method of manufacturing a base material for a printed circuit board includes a step of layering a sintered body layer on at least one surface of a base film having an insulating property, and a step of applying plasma treatment to a surface of the sintered body layer after the layering step. The sintered body layer includes sintered particles formed by sintering metal particles. In the step of applying the plasma treatment, the sintered particles derived from the metal particles are partially embedded into the surface of the base film. The embedment ratio of the sintered particles is greater than or equal to 10% and less than or equal to 90%.

In the above-described method of manufacturing the base material for a printed circuit board, the sintered particles are partially embedded into the surface of the base film such that the embedment ratio is within the above-described range. Therefore, the sintered particles can firmly adhere to the base film by a physical anchoring effect. Accordingly, with the above-described method, it is possible to manufacture the base material for a printed circuit board excellent in adhesion between the base film and the sintered body layer.

In the present disclosure, the "embedment ratio of the sintered particles" refers to a value measured by the following method. A cross-sectional image, in the thickness direction, including the interface between the base film and the sintered body layer is captured by a scanning electron microscope (SEM), and five sintered particles are selected in order of embedment depth from the deepest in an observation area of a 1.1 μm range along the above-described interface. The embedment depth is measured from a point, at which each of the sintered particles is most embedded into the base film, to a virtual straight line along the interface between the body layer and gaps on the left and right sides of each of the sintered particles (between the base film and the sintered body layer) (note that if the number of sintered particles embedded into the surface of the base film is less than 5, the insufficient number of sintered particles are set to a depth of 0 nm). Next, the thickness of each of the sintered particles is measured at the point at which each of the sintered particles is most embedded into the base film. Then, the ratios of the embedment depths to the thicknesses of the five sintered particles are calculated, and the average of the ratios of the embedment depths to the thicknesses of the five sintered particles is calculated and converted into a percentage. In this manner, the "embedment ratio of the sintered particles" is obtained.

Further, in the present disclosure, the "copper nanoparticle" refers to a copper particle having a diameter greater than or equal to 1 nm and less than 1 μm. Further, the term "diameter" refers to a diameter of a particle converted into a perfect circle having the same area. The "peel strength" refers to the peel strength measured by a 180° peeling test in accordance with JIS-C6471 (1995). Further, in the present disclosure, the "contact area ratio between the base film and the sintered body layer including the metal particles" refers to a value measured by the following method. The sintered body layer of the metal particles of the base material for a printed circuit board is dissolved in an acidic solution, such as a cupric chloride solution, to expose the base film, and the surface area A of the base film and the projected surface area B of the base film are measured by an atomic force microscope (AFM). The "contact area ratio" is calculated by (A−B)/B·100(%).

Details of Embodiments of the Present Disclosure

In the following, a base material for a printed circuit board and a method of manufacturing a base material for a printed circuit board according to embodiments of the present disclosure will be described with reference to the drawings.

First Embodiment

<Base material for Printed Circuit Board>

A base material 1 for a printed circuit board illustrated in FIG. 1 includes a base film 2 having insulating properties, and a sintered body layer 3 of metal particles layered on one surface of the base film 2. The base material 1 for a printed circuit board has flexibility and is used as a base material for a flexible printed circuit board. The sintered body layer 3 includes sintered particles 3a that are derived from the metal particles and partially embedded into the surface of the base film 2. In the base material 1 for a printed circuit board, the embedment ratio of the sintered particles 3a is greater than or equal to 10% and less than or equal to 90%.

In the base material 1 for a printed circuit board, the sintered body layer 3 includes the sintered particles 3a that are derived from the metal particles and partially embedded into the surface of the base film 2, and the embedment ratio of the sintered particles 3a is within the above-described range. Therefore, the sintered particles 3a firmly adhere to the base film 2 by a physical anchoring effect. Accordingly, the base material 1 for a printed circuit board is excellent in adhesion between the base film 2 and the sintered body layer 3. In particular, because the base material 1 for a printed circuit board is a base material for a flexible printed circuit board, the base material 1 for a printed circuit board is often bent when used. In the base material 1 for a printed circuit board, because the sintered particles 3*a* are partially embedded into the surface of the base film 2, the edges of the base film 2 (edges of recesses on the surface of the base film 2 formed in correspondence with the embedded sintered particles 3*a*) interfere with the sintered particles 3*a* when bending stress is applied. Thus, it is possible to minimize the peeling of the sintered body layer 3 from the base film 2.

(Base Film)

The base film 2 has insulating properties and flexibility. The main component of the base film 2 is a synthetic resin. Examples of the main component of the base film 2 include a soft material such as polyimide, liquid crystal polyester, polyethylene terephthalate, polyethylene naphthalate, fluoropolymer, and the like. Among these, polyamide that is excellent in heat resistance and adhesion to the sintered body layer 3 is particularly preferable. As used herein, the term "main component" refers to a component having the largest content, for example, a component having a content of 50% by mass or more.

The thickness of the tease film 2 is not particularly limited. For example, the lower limit of the average thickness of the base film 2 is preferably 5 μm and more preferably 12 μm. The upper limit of the average thickness of the base film 2 is preferably 2.0 mm and more preferably 1.6 mm. If the average thickness of the base film 2 is less than the lower limit, the strength of the base film 2 may be insufficient. If the average thickness of the base film 2 exceeds the upper limit, it may be difficult to apply the base material to an electronic device whose thickness is required to foe reduced, or the flexibility may be insufficient.

(Sintered Body Layer)

The sintered body layer 3 is layered directly (i.e., without interposing another layer such as an adhesive layer) on the one surface of the base film 2. Because the sintered body layer 3 adheres to the one surface of the base film 2, the base material 1 for a printed circuit board does not require expensive vacuum equipment for physical vapor deposition as with the case of sputtering. Thus, the manufacturing costs can be reduced.

The sintered body layer 3 has a structure in which the plurality of metal particles adhere to each other by a metal oxide or the like. Examples of metal constituting the metal particles include copper, nickel, aluminum, gold, and silver. In particular, copper that is inexpensive and has excellent conductivity, excellent adhesion to the base film 2, and excellent etching properties is preferable. That is, the metal particles are preferably copper particles, and more preferably copper nanoparticles. When the metal particles are copper nanoparticles, the dense sintered body layer 3 can be formed. Thus, it is possible to readily increase the adhesion to the base film 2 and etching properties while also improving conductivity.

The lower limit of the average particle size of the sintered particles 3*a* is preferably 20 nm and more preferably 30 nm. The upper limit of the average particle size of the sintered particles 3*a* is preferably 300 nm and more preferably 100 nm. If the average particle size of the sintered particles 3*a* is less than the above-described lower limit, it may be difficult to sufficiently obtain an effect of improving the adhesion of the sintered particles 3*a* partially embedded into the base film 2. Conversely, if the average particle size of the sintered particles 3*a* exceeds the above-described upper limit, it may be difficult to form the sufficiently dense sintered body layer 3. Note that the term "average particle size of the sintered bodies" refers to a particle size at which a volume integrated value is 50% in a particle size distribution measured by a surface SEM.

Figure 2:
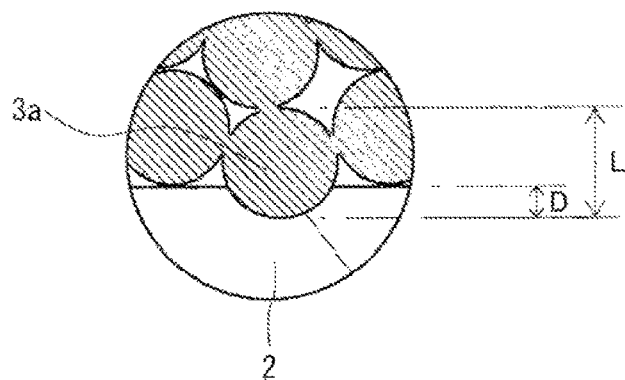
FIG. 2 is a partially enlarged schematic view of an embedded sintered particle of the base material for a printed circuit board of FIG. 1.

As illustrated in FIG. 2, a sintered particle 3*a* constituting the sintered body layer 3 is partially embedded into the surface of the base film 2. More specifically, among a plurality of sintered particles 3*a*, sintered particles 3*a* located at the interface with the base film 2 are partially embedded into the surface of the base film 2. On the surface of the base film 2, recesses are formed in correspondence with the embedded sintered particles 3*a*, and the sintered particles 3*a* are fitted into the recesses. In other words, on the surface of the base film 2 into which the sintered particles 3*a* are embedded, there are no gaps between the embedded sintered particles 3*a* and the surface of the base film 2, and the embedded sintered particles 3*a* completely adhere to the base film 2. Although the shape of the sintered particles 3*a* that are embedded into the base film 2 is not particularly limited, an edge (a projection) that projects radially outwardly is preferably formed at the embedded part. In this manner, by forming such an edge at the embedded part, a physical anchoring effect based on the embedding can be increased.

The lower limit of the embedment ratio obtained as the average of the ratios (D/L) of the embedment depths to the thicknesses of five sintered particles 3*a*, selected in order of embedment depth from the deepest in the above-described observation area, is 10% as described above, preferably 30%, and more preferably 45%, where D denotes the embedment depths of the sintered particles 3*a*, and L denotes the thicknesses of the sintered particles 3*a*. The upper limit of the embedment ratio is 90% as described above, preferably 70%, and more preferably 60%. If the embedment ratio is less than the above-described lower limit, a physical anchoring effect obtained by partially embedding the sintered particles 3*a* may be insufficient, thus resulting in insufficient adhesion between the base film 2 and the sintered body layer 3. Conversely, if the embedment ratio exceeds the above-described upper limit, the output of plasma required to partially embed the sintered particles 3*a* into the base film 2 may be too large, thus causing deterioration of the sintered body layer 3 such as damage or a burn, or the total area of the sintered particles 3*a* protruding from the surface of the base film 2 may be insufficient, thus resulting in insufficient adhesion between the base film 2 and the sintered particles 3*a*.

The lower limit of the presence ratio of sintered particles 3*a* partially embedded into the surface of the base film 2 to a plurality of sintered particles 3*a* contacting the surface of the base film 2 is preferably 25%, more preferably 33%, and even more preferably 50%. Conversely, the upper limit of the presence ratio is preferably 90% and more preferably 35%. If the presence ratio is less than the above-described lower limit, a physical anchoring effect obtained by partially embedding the sintered particles 3*a* may be insufficient, thus resulting in insufficient adhesion between the base film 2 and the sintered body layer 3. Conversely, if the presence ratio exceeds the above-described upper limit, the output of plasma required to partially embed the sintered particles 3*a* into the base film 2 may be too large, thus causing deterioration of the sintered body layer 3 such as damage or a burn, or the total area of the sintered particles 3*a* protruding from the surface of the base film 2 may be insufficient, thus resulting in insufficient adhesion between the base film 2 and the sintered particles 3*a*. Note that the "presence ratio" of sintered particles partially embedded into the surface of the base film to a plurality of sintered particles contacting the surface of the base film refers to a presence ratio determined by capturing a cross-sectional image, in the thickness direction, including the interface between the base film and the sintered body layer by the scanning electron microscope (SEM), and then measuring sintered particles in the 1.1 µm observation area.

The lower limit of the number of sintered particles 3a partially embedded into the surface of the base film 2 per unit length of the interface between the base film 2 and the sintered body layer 3 is preferably 4 particles/µm and more preferably 8 particles/µm. The upper limit of the above-described number is preferably 30 particles/µm and more preferably 20 particles/µm. If the above-described number is less than the above-described lower limit, a physical anchoring effect obtained by partially embedding the sintered particles 3a may be insufficient, thus resulting in insufficient adhesion between the base film 2 and the sintered body layer 3. Conversely, if the above-described number exceeds the above-described upper limit, the output of plasma required to partially embed the sintered particles 3a into the base film 2 may be too large, thus causing deterioration of the sintered body layer 3 such as damage or a burn, or the total area of the sintered particles 3a protruding from the surface of the base film 2 may be insufficient, thus resulting in insufficient adhesion between the base film 2 and the sintered particles 3a.

The lower limit of the average thickness of the sintered body layer 3 is preferably 50 nm, more preferably 70 nm, and even more preferably 100 nm. Conversely, the upper limit off the average thickness of the sintered body layer 3 is preferably 1000 nm, more preferably 700 nm, and even more preferably 500 nm. If the average thickness of the sintered body layer 3 is less than the above-described lower limit, there may be a break in the sintered body layer 3 in plan view, thus resulting in a decrease in conductivity. Conversely, if the average thickness of the sintered body layer 3 exceeds the above-described upper limit, the etching of the sintered body layer 3 may take time at the time of the formation of a printed circuit board, thus resulting in a decrease in productivity.

The lower limit of the peel strength between the base film 2 and the sintered body layer 3 is preferably 7.5 N/cm, more preferably 9.0 N/cm, and even more preferably 10.0 N/cm. If the peel strength is less than the above-described lower limit, the sintered body layer 3 may unexpectedly peel from the base film 2. Higher peel strength is preferable, and the upper limit of the peel strength is not particularly limited. Preferably, the upper limit of the peel strength may be 30.0 N/cm.

Second Embodiment

<Base Material for Printed Circuit Board>

Figure 3:
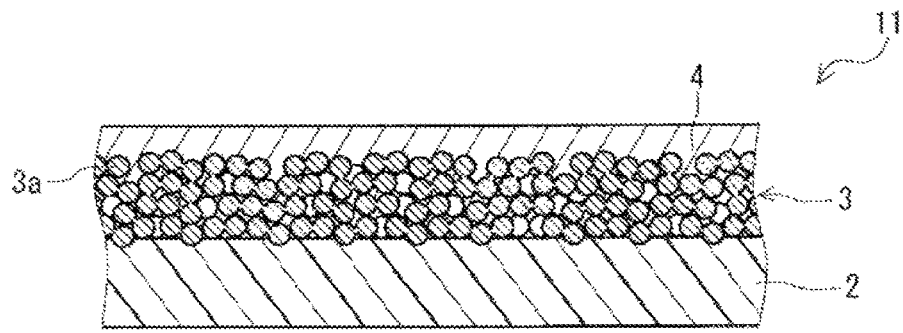
FIG. 3 is a schematic cross-sectional view of a base material for a printed circuit board according to an embodiment different from the embodiment of FIG. 1.

A base material 11 for a printed circuit board illustrated in FIG. 3 includes an electroless plating layer 4 that is layered on the surface of the sintered body layer 3 (the surface of the sintered body layer 3 opposite to the base film 2). The base material 11 for a printed circuit board has flexibility and is used as a base material for a flexible printed circuit board. The configuration of the base material XI for a printed circuit board is similar to that of the base material 1 for a printed circuit board illustrated in FIG. 1, except that the base material 11 for a printed circuit board includes the electroless plating layer 4. In the following, only the electroless plating layer 4 will be described.

(Electroless Plating Layer)

The electroless plating layer A is formed by applying electroless plating to the surface of the sintered body layer 3. The electroless plating layer 4 is layered directly on the surface of the sintered body layer 3. The electroless plating layer 4 includes an electroless plating metal. Gaps between the sintered particles of the sintered body layer 3 are at least partially filled with the electroless plating metal, and preferably, all the gaps between the sintered particles of the sintered body layer 3 are filled with the electroless plating metal. In the base material 11 for a printed circuit board, the electroless plating layer 4 is layered on the surface of the sintered body layer 3, and the gaps between the sintered particles of the sintered body layer 3 are filled with the above-described electroless plating metal. Accordingly, it is possible to increase the adhesion between the base film 2 and the sintered body layer 3, while also improving the conductivity of the sintered body layer 3.

Examples of the above-described electroless plating metal include copper, nickel, and silver having excellent conductivity. Considering the adhesion with the above-described copper nanoparticles, it is preferable to use copper or nickel. The average thickness of the electroless plating layer 4 (from the surface of the sintered body layer 3) may be approximately greater than or equal to 50 nm and less than or equal to 2 µm, such that the surface of the sintered body layer 3 can be sufficiently covered, and also a decrease in productivity due to a long time required for electroless plating can be suppressed.

Third Embodiment

<Base Material for Printed Circuit Board>

Figure 4:
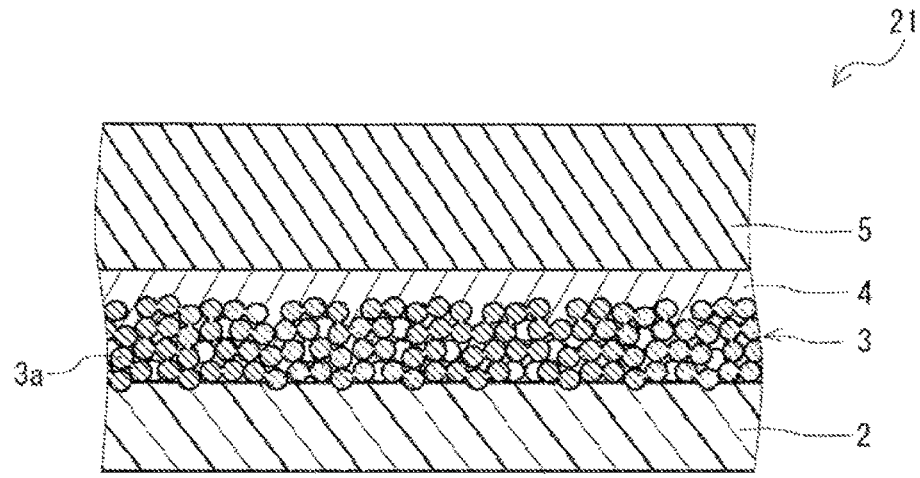
FIG. 4 is a schematic cross-sectional view of a base material for a printed circuit board according to an embodiment different from the embodiments of FIG. 1 and FIG. 3.

A base material 21 for a printed circuit board illustrated in FIG. 4 includes an electroplating layer 5 that is layered on the surface of the electroless plating layer 4 (the surface of the electroless plating layer 4 opposite to the sintered body layer 3). The base material 21 for a printed circuit board has flexibility and is used as a base material for a flexible printed circuit board. The configuration of the base material 21 for a printed circuit board is similar to that of the base material 11 for a printed circuit board illustrated in FIG. 3, except that the base material 21 for a printed circuit board includes the electroplating layer 5. In the following, only the electroplating layer 5 will be described.

(Electroplating Layer)

The electroplating layer 5 is formed by applying electroplating to the surface of the electroless plating layer 4. The electroplating layer 5 is layered directly on the surface of the electroless plating layer A. The electroplating layer 5 includes an electroplating metal. In the base material 21 for a printed circuit board, because the electroplating layer 5 is layered on the surface of the electroless plating layer 4, the total thickness of a laminate consisting of the sintered body layer 3, the electroless plating layer 4, and the electroplating layer 5 can be readily and accurately adjusted.

Examples of the above-described electroplating metal include copper, nickel, and silver, having excellent conductivity. The average thickness of the electroplating layer 5 can be appropriately set depending on what kind of printed circuit is produced, and is not particularly limited. For example, the average thickness of the electroplating layer 5 may be greater than or equal to 1 µm and less than or equal to 100 µm.

[Printed Circuit Board]

Figure 5:
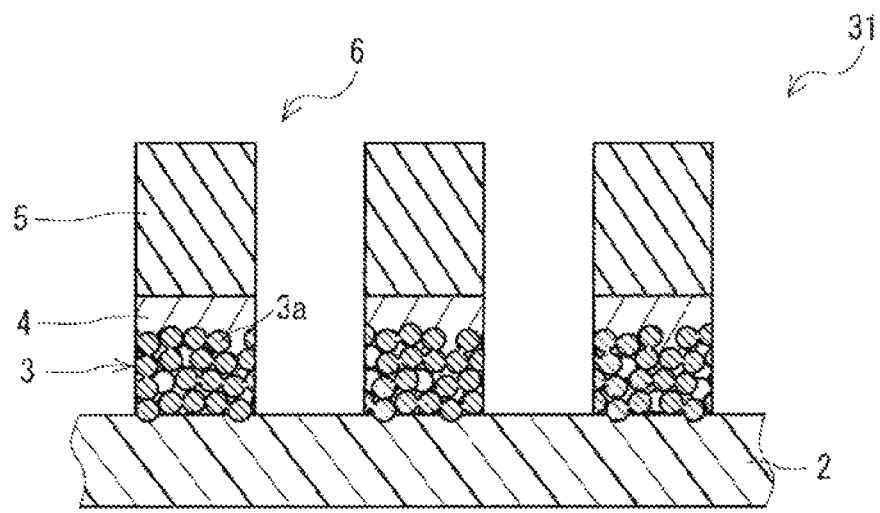
FIG. 5 is a schematic cross-sectional view of a printed circuit board that uses the base material for a printed circuit board of FIG. 4.

A printed circuit board 31 illustrated in FIG. 5 is a flexible printed circuit board having flexibility. For example, the printed circuit board 31 may be formed by using the base material 21 for a printed circuit board illustrated in FIG. 4. The printed circuit board 31 includes a conductive pattern 6 that is layered on one surface of the base film 2. The conductive pattern 6 is obtained by patterning the laminate consisting of the sintered body layer 3, the electroless plating layer 4, and the electroplating layer 5 of the base material 21 for a printed circuit board illustrated in FIG. 4, and includes a portion of the laminate. As the patterning method, a method (subtractive method) of applying a masking such as a resist pattern to the laminate consisting of the sintered body layer 3, the electroless plating layer 4, and the electroplating layer 5 may be used, for example.

Further, the printed circuit board 31 may be formed by a semi-additive method. In this case, the printed circuit board 31 can be formed by using the base material 11 for a printed circuit board illustrated in FIG. 3. Specifically, the printed circuit board 31 can be formed by layering a resist pattern, which is a produced by inverting the shape of the conductive pattern 6, on the surface of the electroless plating layer 4 illustrated in FIG. 3, layering the electroplating layer 5 on a region of the electroless plating layer 4 where no resist pattern is layered, and etching the resist pattern and also the electroless plating layer 4 and the sintered body layer 3 under the resist pattern. By using the above-described semi-additive method to form the printed circuit board 31, a fine circuit pattern can be readily formed.

The printed circuit board 31 has excellent adhesion between the base film 2 and the sintered body layer 3. Therefore, it is possible to readily and securely minimize the peeling of the conductive pattern 6 from the base film 2. In addition, in order to form the printed circuit board 31, the etching of the sintered body layer 3 is required; however, it is possible to minimize a decrease in etching properties by setting the embedment ratio of sintered particles 3a to be less than or equal to the above-described upper limit. Conversely, it is possible to sufficiently increase the contact area between the base film 2 and the sintered body layer 3 by setting the embedment ratio of the sintered particles 3a to be greater than or equal to the above-described lower limit. Thus, even for a fine circuit pattern, the adhesion between the base film 2 and the sintered body layer 3 can be increased. Accordingly, for the printed circuit board, a fine circuit pattern with a line width of greater than or equal to 5 µm and less than or equal to 15 µm and a line space of greater than or equal to 5 µm and less than or equal to 15 µm can be readily and securely formed.

[Method of Manufacturing Base Material for Printed Circuit Board]

Next a method of manufacturing the base material 1 for a printed circuit board illustrated in FIG. 1 will be described with reference to FIG. 6A to FIG. 6C. The method of manufacturing the base material for a printed circuit board is a method of manufacturing a base material for a flexible printed circuit board. The method of manufacturing the base material for a printed circuit board includes a step (layering step) of layering a sintered body layer 13 which includes sintered particles formed by sintering metal particles, on one surface of the insulating base film 2, and a step (plasma treatment step) of applying plasma treatment to the surface of the sintered body layer 13 after the layering step. In the method of manufacturing the base material for a printed circuit board in the plasma treatment step, sintered particles 3a derived from the metal particles are partially embedded into the surface of the base film 2. The embedment ratio of the sintered particles 3a is greater than or equal to 10% and less than or equal to 90%.

In the method of manufacturing the base material for a printed circuit board, in the plasma treatment step, because the sintered particles 3a are partially embedded into the surface of the base film 2 such that the embedment ratio is within the above-described range, the sintered particles 3a can firmly adhere to the base film 2 by a physical anchoring effect. Accordingly, in the above-described method, it is possible to manufacture the base material for a printed circuit board that is excellent in adhesion between the base film 2 and the sintered body layer 3.

(Layering Step)

The above-described layering step includes a step (coating film formation step) of forming a coating film 13a including metal particles 3b on one surface of the base film 2, and a step (drying step) of drying the coating film 13a, formed in the coating film formation step, and a step (sintered body layer formation step) of forming a sintered body layer 13 of the metal particles 3b by sintering the coating film 13a after the drying step. In the following, an example in which the main component of the base film 2 is polyimide will be described. Further, the one surface of the base film 2 may be subjected to surface treatment such as alkali treatment.

<Coating Film Formation Step>

Figure 6A:
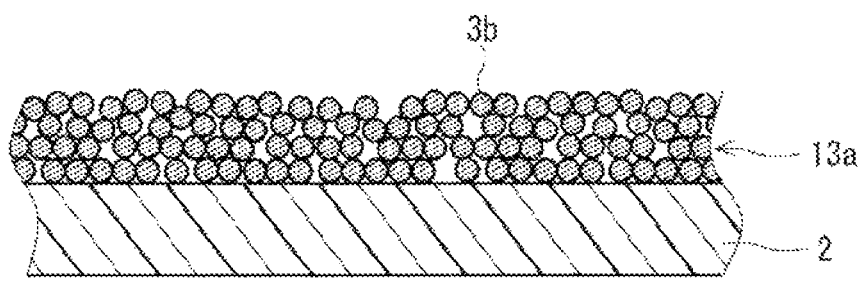
FIG. 6A is a schematic view illustrating an example in which a coating film formation step is performed according to a method of manufacturing the base material for a printed circuit board of FIG. 1.
Figure 6B:
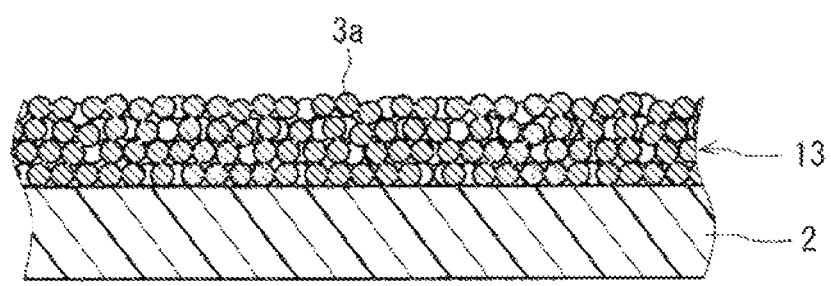
FIG. 6B is a schematic view illustrating an example in which a sintered body layer formation step is performed according to the method of manufacturing the base material for a printed circuit board of FIG. 1.
Figure 6C:
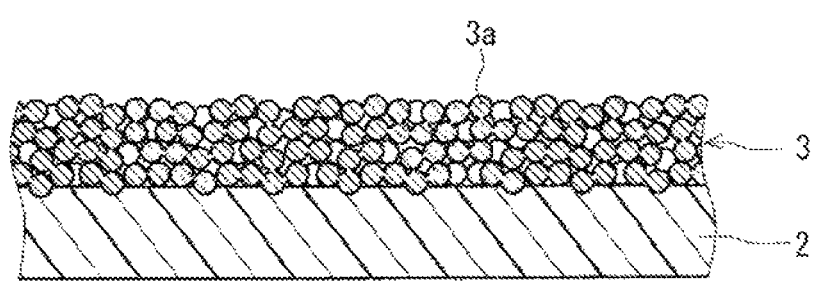
FIG. 6C is a schematic view illustrating an example in which a plasma treatment step is performed according to the method of manufacturing the base material for a printed circuit board of FIG. 1.

In the above-described coating film formation step, as illustrated in FIG. 6A, a coating film 13a is formed by applying a conductive ink including metal particles 3b to one surface of the base film 2.

[Metal Particles]

The metal particles 3b dispersed in the conductive ink can be produced by a high temperature-treatment method, a liquid-phase reduction method, a gas-phase method, or the like. Among these, with the liquid-phase reduction method, the production costs can be reduced and the particle sizes of the metal particles 3b can be readily made uniform by stirring the metal particles 3b in an aqueous solution or the like. Accordingly, when the metal particles 3b are produced by the high temperature-treatment method, the liquid-phase reduction method, the gas-phase method, or the like, the average particle size of the metal particles 3b can be adjusted to greater than or equal to 10 nm and less than or equal to 100 nm. Note that the term "average particle size" refers to a particle size at which a volume integrated value is 50% in a particle size distribution measured by a laser diffraction method.

For example, when the metal particles 3b are produced by the liquid-phase reduction method, a water-soluble metal compound, which is the source of metal ions forming the metal particles 3b, a dispersant, and a complexing agent may be dissolved in water, and a reducing agent may be added to cause a reduction reaction with the metal ions for a certain period of time. The metal particles 3b produced by the liquid-phase reduction method can have uniform spherical or granular shapes, and can be fine particles. As the water-soluble metal compound, which is the source of metal ions, in the case of copper/copper(II) nitrate ($Cu(NO_3)_2$), copper (II) sulfate pentahydrate ($CuSO_4 \cdot 5H_2O$), or the like may be used. In addition, in the case of silver, silver(I) nitrate ($AgNO_3$), silver methanesulfonate ($CH_3SO_3Ag$), or the like may be used. In the case of gold, hydrogen tetrachloroaurate (III) tetrahydrate ($HAuCl_4 \cdot 4H_2O$), or the like, may be used. In the case of nickel, nickel(II) chloride hexahydrate ($NiCl_2 \cdot 6H_2O$), nickel (II) nitrate hexahydrate ($Ni(NO_3)_2 \cdot 6H_2O$), or the like may be used. In the case of other metal particles, water-soluble compounds such as chlorides, nitrate compounds, and sulfate compounds may be used.

As the reducing agent, various reducing agents capable of reducing and precipitating metal ions in a liquid-phase reaction system (aqueous solution) can be used. Examples of the reducing agent include sodium borohydride, sodium hypophosphite, hydrazine, ions of transition metals such as trivalent titanium ions and divalent cobalt ions, ascorbic acid, reducing sugars such as glucose and fructose, and polyhydric alcohols such as ethylene glycol and glycerin. Among these, trivalent titanium ions are preferable as the above-described reducing agent. Note that the liquid-phase reduction method using trivalent titanium ions as a reducing agent is referred to as a titanium redox method. In the titanium redox method, metal ions are reduced by the oxidation-reduction action when trivalent titanium ions are oxidized to tetravalent titanium ions, and metal particles 3b are precipitated. With the titanium redox method, metal nanoparticles that are fine and uniform in size can be readily formed.

The above-described dispersant preferably does not contain sulfur, phosphorus, boron, halogen, or alkali from the viewpoint of preventing deterioration of peripheral members. Examples of preferable dispersants include nitrogen-containing polymer dispersants such as polyethyleneimine and polyvinylpyrrolidone; hydrocarbon-based polymer dispersants having a carboxy group in a molecule such as polyacrylic acid; cellulose-based polymer dispersants such as carboxymethylcellulose; and polymer dispersants having a polar group such as POVAL (polyvinyl alcohol), a styrene-maleic acid copolymer, an olefin-maleic acid copolymer, a copolymer having a polyethyleneimine moiety and a polyethylene oxide moiety in one molecule, and the like.

Examples of the above-described complexing agent include sodium citrate, sodium tartrate, sodium acetate, gluconic acid, sodium thiosulfate, ammonia, and ethylenediaminetcetraacetic acid. Any one of the above compounds may be used, or two or more of the above compounds may be used. Among these, sodium citrate is preferably used as the above-described complexing agent.

In order to adjust the particle sizes of the metal particles 3b, the type and the mixing ratio of the metal compound, the dispersant, and the reducing agent may be adjusted, and also, the stirring rate, the temperature, the time, the pH, and the like may be adjusted when the metal compound is subjected to the reduction reaction. The lower limit of the pH of the reaction system is preferably 7, and the upper limit of the pH of the reaction system is preferably 13. By setting the pH of the reaction system to the above-described range, it is possible to obtain the metal particles 3b having fine particle sizes. In this case, by using a pH adjusting agent, it is possible to readily adjust the pH of the reaction system to the above-described range. Examples of the pH adjusting agent include a commonly-used acid or alkali, such as hydrochloric acid, sulfuric acid, nitric acid, sodium hydroxide, sodium carbonate, and ammonia. In order to prevent deterioration of the peripheral members, nitric acid and ammonia, which do not contain impurities, such as alkaline metal, alkaline earth metal, halogen element, sulfur, phosphorus, boron and the like, are preferable.

Note that when the metal particles 3b are produced by the liquid-phase reduction method, the metal particles 3b precipitated in a liquid-phase reaction system (aqueous solution) can be prepared by using a conductive ink that has been made into a powder through steps of filtration, washing, drying, disintegration, and the like. In this case, the powdery metal particles 3b, a dispersion medium such as water, and according to need, a dispersant, an organic solvent, or the like may be mixed at a predetermined ratio to form a conductive ink including the metal particles 3b. At this time, it is preferable to prepare the conductive ink by using the liquid phase (aqueous solution), in which the metal particles 3b have been precipitated, as a starting material. Specifically, the liquid phase (aqueous solution) including the precipitated metal particles 3b is subjected to treatment such as ultrafiltration, centrifugation, water washing, and electrodialysis to remove impurities, and when necessary, is concentrated to remove water. Alternatively, a conductive ink including the metal particles 3b may be prepared by adding water to adjust the concentration of the metal particles 3b, followed by mixing an organic solvent at a predetermined ratio when necessary. With this method, it is possible to prevent the generation of coarse and irregular particles due to aggregation of the metal particles 3b when being dried, thereby allowing the dense and uniform sintered body layer 13 to be readily formed.

The lower limit of the content of the metal particles 3b in the conductive ink is preferably 5% by mass, more preferably 10% by mass, and even more preferably 20%. Further, the upper limit of the content of the metal particles 3b in the conductive ink is preferably 50% by mass, more preferably 40% by mass, and even more preferably 30% by mass. By setting the content of the metal particles 3b to be greater than or equal to the above-described lower limit, the coating film 13a can be formed into a denser film. Conversely, if the content ratio of the metal particles 3b exceeds the above-described upper limit, the thickness of the coating film 13a may be uneven.

[Method of Applying Ink]

As a method of applying the conductive ink, in which the metal particles 3b are dispersed, to the one surface of the base film 2, a known application method such as a spin coating method, a spray coating method, a bar coating method, a die coating method, a slit coating method, a roll coating method, or a dip coating method may be used. Further, the conductive ink may be applied to only part of the one surface of the base film 2 by screen printing, a dispenser, or the like.

In the above-described coating film formation step, it is preferable to densely apply the metal particles 3b to the one surface of the base film 2. The lower limit of the ratio of the thickness of the sintered body layer 13 (the sintered body layer 13 formed in the sintered body layer formation step as will be described later), measured by an X-ray fluorescence spectrometer, to the thickness of the metal particles 3b in the coating film 13a is preferably 0.3 and more preferably 0.4. If the above-described ratio is less than the above-described lower limit, the adhesion between the sintered body layer 13 and the base film 2 may be insufficient. Note that the "thickness of the metal particles in the coating film" refers to an average value of measurement values obtained by exposing the base film by a cross section polisher (CP), capturing a cross sectional image in the thickness direction of the base film by the scanning electron microscope (SEM), and measuring distances from apexes of 10 metal particles located on the outermost layer of the coating film to the one surface of the base film.

<Drying Step>

In the above-described drying step, the dispersion medium included in the coating film 13a formed in the coating film formation step is dried. In the drying step, it is preferable to dry the dispersion medium before the metal particles 3b are aggregated.

<Sintered Body Layer Formation Step>

In the above-described sintered body layer formation step, as illustrated in FIG. 63, the sintered body layer 13 of the metal particles 3b is formed by sintering the coating film 13a. The sintered body layer 13 includes sintered particles 3a that are derived from the metal particles 3b.

<Sintering>

As a result of the above-described sintering, the metal particles 3b are sintered with each other, and the sintered particles 3a adhere to the one surface of the base film 2. It should be noted that, a certain amount of the dispersant and other organic substances that may be included in the conductive ink are volatilized or decompose by sintering. The lower limit of the content of nitrogen atoms in the sintered body layer 13 is preferably 0.5 atomic, more preferably 0.8 atomic, and even more preferably 1.0 atomic. Conversely, the upper limit of the content of nitrogen atoms in the sintered body layer 13 is preferably 5.0 atomic, more preferably 4.0 atomic, and even more preferably 3.0 atomic. If the above-described content is less than the above-described lower limit, the peel strength of the sintered body layer 13 from the base film 2 may be insufficient. Conversely, if the above-described content exceeds the above-described upper limit, the bond between the metal particles 3b may be insufficient, thus resulting in insufficient strength or corrosion resistance of the sintered body layer 13.

The upper limit of the oxygen concentration in the sintering atmosphere is preferably 10,000 ppm by volume and more preferably 1,000 ppm by volume. If the oxygen concentration exceeds the above-described upper limit, the metal particles 3b may be excessively oxidized, and the conductivity of the sintered body layer 13 may decrease. The lower limit of the oxygen concentration is not particularly limited. In order to avoid unnecessarily expensive manufacturing equipment, the lower limit of the oxygen concentration may be preferably 1 ppm by volume and more preferably 10 ppm by volume.

The lower limit of the sintering temperature is preferably 150° C. and more preferably 200° C. Conversely, the upper limit of the sintering temperature is preferably 500° C. and more preferably 400° C. If the sintering temperature is less than the lower limit, the adhesion between the base film 2 and the sintered body layer 13 may be unable to be sufficiently increased. Conversely, if the sintering temperature exceeds the above-described upper limit, the base film 2 may be deformed. Note that the sintering time may be in a range of greater than or equal to 30 minutes and less than or equal to 600 minutes, although not particularly limited.

(Plasma Treatment Step)

In the above-described plasma treatment step, the surface of the sintered body layer 13 layered in the layering step is irradiated with plasma, such that the sintered particles 3a constituting the sintered body layer 13 are partially embedded into the surface of the base film 2. The plasma treatment step is performed by vacuum plasma treatment using a vacuum chamber, for example. In the plasma treatment step, as illustrated in FIG. 6C, a sintered body layer 3, including sintered particles 3a that are derived from the metal particles 3b and partially embedded into the surface of the base film 2, is formed on the one surface of the base film 2.

Examples of a gas used in the plasma treatment in the above-described plasma treatment step include oxygen, nitrogen, air, and fluorine-based gas. These gases may be used alone, or two or more gases may be used in combination.

The lower limit of the gas flow rate in the above-described plasma treatment Is preferably 150 sccm and more preferably 200 sccm. Conversely, the upper limit of the gas flow rate is preferably 300 sccm and more preferably 250 sccm. If the gas flow rate is outside the above-described range, it may be difficult to stabilize plasma and to control the embedment amount of the sintered particles 3a into the surface of the base film 2.

The lower limit of the linear velocity of a gas supplied into the chamber is preferably 1.5 m/min and more preferable 1.7 m/min. Conversely, the upper limit of the linear velocity is preferably 3.0 m/min and more preferably 2.5 m/min. If the linear velocity is less than the above-described lower limit, the embedment amount of the sintered particles 3a into the surface of the base film 2 may be insufficient. Conversely, if the linear velocity exceeds the above-described upper limit, the embedment amount of the sintered particles 3a into the surface of the base film 2 may be too large, and thus the total area of the sintered particles 3a protruding from the surface of the base film 2 may be insufficient.

The lower limit of the plasma output in the above-described plasma treatment is preferably 300 W, more preferably 700 W, even more preferably 1000 W, and most preferably 1250 W. Conversely, the upper limit of the plasma output is preferably 2000 W and more preferably 1800 W. If the plasma output is less than the above-described lower limit, the embedment amount of the sintered particles 3a into the surface of the base film 2 may be insufficient. Conversely, if the plasma output exceeds the above-described upper limit, the embedment amount of the sintered particles 3a into the surface of the base film 2 may be too large, and thus the total area of the sintered particles 3a protruding from the surface of the base film 2 may be insufficient.

The lower limit of the plasma treatment time in the above-described plasma treatment step is preferably 3 seconds and more preferably 6 seconds. Conversely, the upper limit of the plasma treatment time is preferably 40 seconds and more preferably 30 seconds. If the plasma treatment time is less than the above-described lower limit, it may be difficult for the sintered particles 3a to be sufficiently embedded into the surface of the base film 2. Conversely, if the plasma treatment time exceeds the above-described upper limit, the embedment amount of the sintered oar tides 3a into the surface of the base film 2 may be too large, and thus the total area of the sintered particles 3a protruding from the surface of the base film 2 may be insufficient.

Next, a method of manufacturing the base material 11 for a printed circuit board illustrated in FIG. 3 and a method of manufacturing the base material 21 for a printed circuit board illustrated in FIG. 4 will be described. The method of manufacturing the base material 11 for a printed circuit board illustrated in FIG. 3 includes a step (electroless plating applying step) of applying electroless plating to the surface of the sintered body layer 3 after the above described plasma treatment step. The method of manufacturing the base material 21 for a printed circuit board illustrated in FIG. 4 includes a step (electroplating step) of applying electroplating to the surface of the electroless plating layer 4 formed in the electroless plating applying step.

Examples of metal used in the electroless plating applying step include copper, nickel, and silver. Considering the adhesion with the sintered body layer 3 when copper particles are used as metal particles 3b, it is preferable to use copper or nickel. Examples of metal used in the electroplating step include copper, nickel, and silver.

Other Embodiments

It should be understood that the embodiments disclosed herein are exemplary in all respects and are not intended to be restrictive. The scope of the present invention is not defined by the above-described embodiments, tout defined by the scope of claims, and is intended to include all modifications within the meaning and range equivalent to the scope of the claims.

For example, in the above-described embodiments, a configuration in which the sintered body layer is layered on the one surface of the base film has been described; however, in the base material for a printed circuit board, a pair of sintered body layers may be layered on the both surfaces of the base film. Further, in the method of manufacturing the base material for a printed circuit board, a pair of sintered body layers of metal particles may be layered on the both surfaces of the base film.

As described above, the base material for a printed circuit board is a base material for a flexible printed circuit board. Therefore, it is readily possible to minimize the peeling of the sintered body layer from the base film when bending stress is applied. However, the base material for a printed circuit board may be a rigid base material that does not have flexibility.

When another layer (e.g., a metal layer such as a plating layer) is layered on the surface of the sintered body layer, the configuration of the other layer is not particularly limited. In the base material for a printed circuit, board, the electroplating layer may be directly layered on the surface of the sintered body layer.

EXAMPLES

Although the present invention will be described below in more detail with reference to Examples, the present invention is not limited to these Examples.

Examples

[No. 1]

As a base film, a polyimide film ("APICAL NPI" manufactured by Kaneka Corporation) having an average thickness of 25 µm was prepared. The base film was immersed in an aqueous sodium hydroxide solution having a concentration of 100 g/L at 40° C. for 90 seconds and washed with water. Subsequently, the base film was washed with an aqueous acetic acid solution having a concentration of 1% by mass, washed with water, and then dried. Then, one surface of the base film was subjected to alkali treatment. Next, copper nanoparticles having an average particle size of 80 nm were dispersed in water to obtain a conductive ink including the copper nanoparticles. The conductive ink was applied to the one surface of the base film, and the base film was sintered and dried. As a result, a sintered body layer, including sintered particles formed by sintering the copper nanoparticles, was layered on the one surface of the base film (layering step).

Next, under the following conditions, a vacuum plasma apparatus, manufactured by Top Range Machinery Co., Ltd., was used to apply plasma treatment to the surface of the sintered body layer layered in the above layering step (plasma treatment step).

Plasma type: Microwave plasma
Linear velocity: 2 m/min
Gas: Mixed gas of oxygen and tetrafluoromethane
Gas flow rate: oxygen 200 sccm, tetrafluoromethane 20 sccm
Pressure in chamber: 80 Pa
Plasma output: 500 W
Plasma treatment time: 7 seconds Electroless plating was applied to the surface of the sintered body layer after the above plasma treatment step (electroless plating applying step). Further, electroplating was applied to the surface of the electroless plating layer formed in the electroless plating applying step (electroplating step), and the total thickness of the sintered body layer, the electroless plating layer, and the electroplating layer was adjusted to 20 µm. As a result, a base material for a printed circuit board of No. 1 was manufactured.

[No. 2 to No. 6]

Base materials for printed circuit boards of No. 1 to No. 6 were manufactured in the same manner as that of No. 1, except that the output of plasma in the plasma treatment step was varied as Indicated in Table 1.

[No. 7]

A base material for a printed circuit board of No. 7 was manufactured in the same manner as that of No. 1, except that the plasma treatment step was not performed.

<Embedment Depth of Sintered Particles>

For each of the base materials for printed circuit boards of No. 1 to No. 7, a cross-sectional image, in the thickness direction, including the interface between a base film and a sintered body layer was captured by the scanning electron microscope (SEM), and five sintered particles were selected in order of embedment depth from the deepest in an observation area of a 1.1 µm range along the above-described interface. The embedment depth was measured from a point, at which each of the sintered particles was most embedded into the base film, to a virtual straight line along the interface between the body layer and gaps on the left and right sides of each of the sintered particles (between the base film and the sintered body layer) (note that if the number of sintered particles embedded into the surface of the base film is less than 5, the insufficient number of sintered particles is set to a depth of 0 nm). The average of the depths of the five sintered particles was calculated as the embedment depth of the sintered particles. The measurement results are indicated in Table 1.

<Embedment Ratio of Sintered Particles>

For each of the base materials for printed circuit boards of No. 1 to No. 7, the thickness of each of the five sintered particles was measured at the point at which each of the five sintered particles was most embedded into the base film. Then, the ratios of the embedment depths to the thicknesses of the five sintered particles are calculated, and the average of the ratios of the embedment depths to the thicknesses of the five sintered particles was calculated and converted into a percentage. The calculation results are indicated in Table 1. Note that boundaries between the sintered particles were identified by adjusting the brightness and contrast of the above-described cross-sectional image.

<Presence Ratio of Sintered Particles>

For each of the base materials for printed circuit boards of No. 1 to No. 7, ten cross-sectional images, in the thickness direction, including the interface between the base film and the sintered body layer were captured by the scanning electron microscope (SEM) at a magnification of 100,000. In a 1.1-µm observation area of each of the cross-sectional images, the presence ratio of sintered particles partially embedded into the surface of the base film to a plurality of sintered particles contacting the surface of the base film was calculated. Next, for each of the base materials for printed circuit boards of No. 1 to No. 7, the average of the presence ratios in the ten cross-sectional images was calculated as the presence ratio of the sintered particles. The calculation results are indicated in Table 1.

<Number of Embedded Sintered Particles Per Unit Length>

For each of the base materials for printed circuit boards of No. 1 to No. 7, ten cross-sectional images, in the thickness direction, including the interface between the base film and the sintered body layer were captured by the scanning electron microscope (SEM) at a magnification of 100,000. In a 1.1-μm observation area of each of the cross-sectional images, the number of sintered particles partially embedded into the surface of the base film per unit length of the interface between the base film and the sintered body layer was calculated. Next, the average of the numbers in the ten cross-sectional images was calculated as the number of sintered particles partially embedded into the surface of the base film per unit length. The calculation results are indicated in Table 1.

<Contact Area Ratio Between Base Film and Sintered Body Layer Including Metal Particles>

For each of the base materials for printed circuit boards of No. 1 to No. 7, the sintered body layer including copper nanoparticles was dissolved in an acidic solution, such as a cupric chloride solution, to expose the base film. Then, the surface area A of the base film and the projected surface area B of the base film were measured by the atomic force microscope (AFM). The contact area ratio was calculated by $(A-B)/B \cdot 100(\%)$. The Dimension Icon with ScanAsyst manufactured by Veeco was used as the atomic force microscope, and the contact area ratio was calculated by measuring an area of 2500 μm² (50-μm width and 50-μm length) in trapping mode by using a silicon probe with a radius of 10 nm. The calculation results are indicated in Table 1.

<Peel Strength>

For each of the base materials for printed circuit boards of No. 1 to No. 7, the peel strength (initial adhesion) between the base film and the sintered body layer was measured by a 180° peeling test in accordance with JTS-C6471 (1995). The measurement results of the peeling strength are indicated in Table 1.

[Evaluation Results]

As illustrated in Table 1, the embedment depth, the embedment ratio, the presence ratio, the number of embedded sintered particles per unit length, and the contact area ratio between a base film and a sintered body layer including metal particles in each of No. 1 to No. 6 in which the plasma treatment is applied to the surface of the sintered body layer, were larger than those of No. 7 in which the plasma treatment is not applied. Further, as the values increase in each of No. 1 to No. 6, the peel strength between the base film and the sintered body layer tends to increase, and the adhesion between the base film and the sintered body layer increases. This is because a physical anchoring effect increases as the embedment ratio of sintered particles increases. In addition, by maintaining the embedment ratio of the sintered particles within the above-described range, it is possible to sufficiently secure the total area of the sintered particles protruding from the surface of the base film, while also sufficiently securing the contact area between the sintered particles partially embedded into the surface of the base film and other sintered particles constituting the sintered body layer.

DESCRIPTION OF REFERENCE NUMERALS 1, 11, 21 base material for printed circuit board
2 base film
3, 13 sintered body layer
3a sintered particle
3b metal particle
4 electroless plating layer
5 electroplating layer
6 conductive pattern
13a coating film
31 printed circuit board

The invention claimed is:

1. A base material for a printed circuit board comprising:
a base film having an insulating property; and
a sintered body layer including metal particles and layered on at least one surface of the base film, wherein
the sintered body layer includes sintered particles that are derived from the metal particles and partially embedded into the surface of the base film, and
an embedment ratio of the sintered particles is greater than or equal to 10% and less than or equal to 90%,
wherein a contact area ratio represented by $(A-B)/B \cdot 100$ is greater than or equal to 0.05% and less than or equal to 0.50%, where A denotes a contact area between the base film and the sintered body layer including the metal particles, and B denotes a projected surface area of the base film.

2. The base material for a printed circuit board according to claim 1, wherein the metal particles are copper particles each having a diameter of greater than or equal to 1 nm and less than 1 μm.

3. The base material for a printed circuit board according to claim 1, wherein peel strength between the base film and the sintered body layer is greater than or equal to 7.5 N/cm.

4. A base material for a printed circuit board comprising:
a base film having an insulating property; and
a sintered body layer including metal particles and layered on at least one surface of the base film, wherein

TABLE 1

| NO | PLASMA OUTPUT [W] | EMBEDMENT DEPTH OF SINTERED PARTICLES [nm] | EMBEDMENT RATIO OF SINTERED PARTICLES [%] | PRESENCE RATIO OF EMBEDDED SINTERED PARTICLES [%] | NUMBER OF EMBEDDED SINTERED PARTICLES PER UNIT LENGTH [PARTICLES/μm] | CONTACT AREA RATIO BETWEEN BASE FILM AND SINTERED BODY LAYER OF METAL PARTICLES [%] | PEEL STRENGTH [N/cm] |
|---|---|---|---|---|---|---|---|
| 1 | 500 | 9.2 | 16.3 | 27 | 4 | 0.107 | 7.6 |
| 2 | 750 | 13.9 | 24.5 | 47 | 9 | 0.157 | 8.2 |
| 3 | 1000 | 18.3 | 33.5 | 50 | 8 | 0.187 | 9.2 |
| 4 | 1250 | 18.9 | 46.2 | 82 | 14 | 0.209 | 10.4 |
| 5 | 1500 | 21.1 | 50.4 | 81 | 13 | 0.228 | 11.1 |
| 6 | 1500 W × 2 | 19.6 | 70.1 | 81 | 13 | 0.350 | 10.5 |
| 7 | — | 3.9 | 9.3 | 16 | 3 | 0.044 | 7.0 | the sintered body layer includes sintered particles that are derived from the metal particles and partially embedded into the surface of the base film, an embedment ratio of the sintered particles is greater than or equal to 10% and less than or equal to 90%, and, the embedment ratio of the sintered particles is defined as a percentage that is converted from an average of ratios (D/L) of embedment depths to thicknesses of five sintered particles that are selected in order of embedment depth from a deepest embedment depth in an observation area, said D denoting a embedment depth of each sintered particle of the five sintered particles, and said L denoting a thickness of said each sintered particle of the five sintered particles at the embedment depth, if the number of sintered particles embedded into the surface of the base film is less than 5, a sintered particle that is not embedded into the surface of the base film is set to have a depth of 0 nm for a purpose of calculating the average of the ratios (D/L), said observation area being defined as an area of a 1.1 µm range along an interface between the base film and the sintered body layer in a cross-section in the thickness direction of the base material, said embedment depth denoting a depth of a point that is most embedded into the base film relative to an imaginary straight line that includes an interface between gaps on left and right sides of the sintered particle and the base film, said gaps denoting gaps formed between the base film and the sintered body layer.

5. A printed circuit board comprising:
the base material according to claim 4, wherein the sintered body layer forms a conducting pattern.

6. A base material for a printed circuit board comprising:
a base film having an insulating property; and
a sintered body layer including metal particles and layered on at least one surface of the base film, wherein
the sintered body layer includes sintered particles that are derived from the metal particles and partially embedded into the surface of the base film,
an average embedment depth of the sintered particles is 9.2 nm or more and 21.1 nm or less,
said average embedment depth is an average value of embedment depths of five sintered particles that are selected in order of embedment depth from a deepest embedment depth in an observation area, and
if the number of sintered particles embedded into the surface of the base film is less than 5, a sintered particle that is not embedded into the surface of the base film is set to have a depth of 0 nm for a purpose of the average embedment depth,
said observation area being defined as an area of a 1.1 µm range along an interface between the base film and the sintered body layer in a cross-section in the thickness direction of the base material,
said embedment depth denoting a depth of a point that is most embedded into the base film relative to an imaginary straight line that includes an interface between gaps on left and right sides of the sintered particle and the base film,
said gaps denoting gaps formed between the base film and the sintered body layer.

7. The base material for a printed circuit board according to claim 6, wherein a peel strength between the base film and the sintered body layer is 7.6 N/cm or more and 11.1 N/cm or less.

8. The base material for a printed circuit board according to claim 6, wherein a recess corresponding to a surface of the sintered particle and into which the sintered particle is fitted is formed on the surface of the base film.

9. The base material for a printed circuit board according to claim 6, wherein the metal particles are copper particles each having a diameter of greater than or equal to 1 nm and less than 1 µm.

10. The base material for a printed circuit board according to claim 6, wherein a contact area ratio represented by $(A-B)/B \cdot 100$ is greater than or equal to 0.05% and less than or equal to 0.50%, where A denotes a contact area between the base film and the sintered body layer including the metal particles, and B denotes a projected surface area of the base film.

11. A printed circuit board comprising:
a base film having an insulating property; and
a sintered body layer including metal particles and layered on at least one surface of the base film, wherein
the sintered body layer includes sintered particles that are derived from the metal particles and partially embedded into the surface of the base film,
an average embedment depth of the sintered particles is 9.2 nm or more and 21.1 nm or less,
within a range where the average embedment depth of the sintered particles is 1.1 µm along an interface in a cross section in a thickness direction including the interface between the base film and the sintered body layer, said average embedment depth is defined as a depth into the base film relative to an imaginary straight line, said imaginary straight line including an interface between gaps existing on left and right sides of the sintered particles and the base film,
said gaps are formed between the base film and the sintered body layer,
said average embedment depth is an average value of the embedment depths of five sintered particles in descending order of the embedment depth, and
if the number of sintered particles embedded into the surface of the base film is less than 5, a sintered particle that is not embedded into the surface of the base film is set to have a depth of 0 nm.

* * * * *